(12) United States Patent
Ha et al.

(10) Patent No.: US 10,396,825 B2
(45) Date of Patent: Aug. 27, 2019

(54) MEMORY CONTROLLER, SEMICONDUCTOR MEMORY SYSTEM AND OPERATING METHOD THEREOF

(71) Applicants: SK hynix Inc., Gyeonggi-do (KR); Korea Advanced Institute of Science and Technology, Daejeon (KR)

(72) Inventors: Jeong-Seok Ha, Daejeon (KR); Dae-Sung Kim, Gwangju (KR)

(73) Assignees: SK hynix Inc., Gyeonggo-do (KR); Korea Advanced Institute of Science and Technology, Daejeon (KR)

(*) Notice: Subject to any disclaimer, the term of this patent is extended or adjusted under 35 U.S.C. 154(b) by 35 days.

(21) Appl. No.: 15/627,541

(22) Filed: Jun. 20, 2017

(65) Prior Publication Data

US 2018/0091171 A1    Mar. 29, 2018

(30) Foreign Application Priority Data

Sep. 26, 2016    (KR) ........................ 10-2016-0123060

(51) Int. Cl.
| | |
|---|---|
| *H03M 13/29* | (2006.01) |
| *H03M 13/15* | (2006.01) |
| *G06F 11/10* | (2006.01) |
| *H03M 13/00* | (2006.01) |
| *H03M 13/11* | (2006.01) |

(52) U.S. Cl.
CPC ..... *H03M 13/2927* (2013.01); *G06F 11/1076* (2013.01); *H03M 13/293* (2013.01); *H03M 13/2909* (2013.01); *H03M 13/616* (2013.01); *H03M 13/1102* (2013.01); *H03M 13/152* (2013.01); *H03M 13/1515* (2013.01); *H03M 13/2957* (2013.01)

(58) Field of Classification Search
CPC ........... G06F 11/1076; H03M 13/2909; H03M 13/293; H03M 13/616; H03M 13/1102; H03M 13/1515; H03M 13/152; H03M 13/2957

See application file for complete search history.

(56) References Cited

U.S. PATENT DOCUMENTS

| | | | | |
|---|---|---|---|---|
| 5,247,523 | A * | 9/1993 | Arai ........................ | G06F 11/10 714/748 |
| 2007/0044006 | A1 * | 2/2007 | Yang .................. | G11B 20/1833 714/785 |

(Continued)

FOREIGN PATENT DOCUMENTS

KR    1020150107862    9/2015

OTHER PUBLICATIONS

Wolf, J. K., An Introduction to Tensor Product Codes and Applications to Digital Storage Systems, Proceedings of 2006 IEEE Information Theory Workshop, pp. 6-10.

*Primary Examiner* — Kyle Vallecillo
(74) *Attorney, Agent, or Firm* — IP & T Group LLP

(57) ABSTRACT

An operation method of a memory controller may include performing a first decoding operation to a message of an internal region included in a codeword received from a semiconductor memory device by using an internal parity, wherein the message and the internal parity are included in the internal region in a matrix form; and performing a second decoding operation to the internal region, to which the first decoding operation is performed, by using an outer parity of an outer region.

14 Claims, 12 Drawing Sheets

(56) References Cited

U.S. PATENT DOCUMENTS

2014/0208189 A1* 7/2014 Parthasarathy ....... H03M 13/13
714/780
2016/0350184 A1* 12/2016 Varanasi ............. G06F 11/1072

* cited by examiner

MEMORY CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2016-0123060, filed on Sep. 26, 2016, which is incorporated herein by reference in its entirety.

BACKGROUND

1. Field

Various exemplary embodiments of the present invention relate to a memory controller, a semiconductor memory system and an operating method thereof.

2. Description of the Related Art

In general, semiconductor memory devices are classified into volatile memory devices, such as Dynamic Random Access Memory (DRAM) and Static RAM (SRAM), and non-volatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

Volatile memory devices lose their stored data when their power supplies are interrupted, whereas non-volatile memory devices retain their stored data even when their power supplies are interrupted. Non-volatile flash memory devices are widely used as storage mediums in computer systems because of their high program speed, low power consumption and large data storage capacity.

In non-volatile memory devices, especially in flash memory devices, the data state of each memory cell depends on the number of bits that the memory cell can program. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. An MLC is advantageous for high integration. However, as the number of bits programmed in each memory cell increases, the reliability decreases and the read failure rate increases.

For example, when k bits are to be programmed in a memory cell, one of $2^k$ threshold voltages is formed in the memory cell. Due to minute differences between the electrical characteristics of memory cells, the threshold voltages of memory cells programmed for the same data form threshold voltage distributions. Threshold voltage distributions correspond to $2^k$ data values corresponding to k-bit information, respectively.

However a voltage window available for the various threshold voltage distributions is finite. Therefore as the value of k increases, the distance between consecutive threshold voltage distributions decreases and the probability that neighbouring threshold voltage distributions may overlap also increases. When neighbouring threshold voltage distributions overlap, read data may include error bits.

FIG. 1 is threshold voltage distribution schematically illustrating program and erase states of a 3-bit MLC non-volatile memory device.

FIG. 2 is a threshold voltage distribution schematically illustrating program and erase states due to characteristic deterioration of the 3-bit MLC non-volatile memory device.

In an MLC non-volatile memory device, e.g., an MLC flash memory device capable of storing k-bit data in a single memory cell, the memory cell may have one of $2^k$ threshold voltage distributions. For example, the 3-bit MLC of FIG. 1, may have 8 possible threshold voltage distributions.

Threshold voltages of memory cells programmed for the same data form a threshold voltage distribution due to characteristic differences between memory cells. In the 3-bit MLC non-volatile memory device as illustrated in FIG. 1, threshold voltage distributions are formed in correspondence with the data states including 7 program states 'P1' to 'P7' and an erase state 'E'. FIG. 1 shows an ideal case in which threshold voltage distributions do not overlap and have sufficient read voltage margins therebetween.

Referring to the flash memory example of FIG. 2, the memory cell may experience a charge loss in which electrons trapped at a floating gate or tunnel oxide film are discharged over time. Such charge loss may accelerate when the tunnel oxide film deteriorates by iterative program and erase operations. Charge loss results in a decrease in the threshold voltages of memory cells, hence, for example, as illustrated in FIG. 2, the threshold voltage distribution may be shifted left due to a charge loss.

Further, program disturbance, erase disturbance and/or back pattern dependency may cause increases in threshold voltages. As the characteristics of memory cells deteriorate, neighbouring threshold voltage distributions may overlap, as illustrated in FIG. 2.

Once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap a memory cell that has the third program state 'P3' may be erroneously determined to have the second program state 'P2'. In short, when the neighbouring threshold voltage distributions overlap as illustrated in FIG. 2, read data may include a significant number of errors.

What is therefore required is a scheme for reliably and quickly reading data stored in memory cells of a semiconductor memory device, especially in multi-level memory cells of a highly-integrated memory device.

SUMMARY

Various embodiments of the present invention are directed to a memory controller, a semiconductor memory system and an operating method thereof capable of reliably and quickly reading data stored in memory cells of a semiconductor memory device, especially, in multi-level memory cells of a highly-integrated memory device.

In accordance with an embodiment of the present invention, an operation method of a memory controller may include: performing a first decoding operation to a message of an internal region included in a codeword received from a semiconductor memory device by using an internal parity, wherein the message and the internal parity are included in the internal region in a matrix form; and performing a second decoding operation to the internal region, to which the first decoding operation is performed, by using an outer parity of an outer region.

Preferably, the performing of the second decoding operation may include: detecting one or more errors of symbols included in one or more rows of the internal region, to which the first decoding operation is performed, by using the outer parity of the outer region; and flipping values of the symbols included in one or more columns, in which the error-detected symbols are included.

Preferably, the operation method may further comprise after the flipping of the values performing the first decoding operation to the internal region, to which the second decoding operation is performed.

Preferably, the second decoding operation may be performed through a BCH code.

Preferably, the first decoding operation may be performed through a Tensor Product Code.

Preferably, the performing of the first decoding operation may include: generating a phantom syndrome message for the internal region using a parity check matrix of a first constituent code of the Tensor Product Code; error correcting the phantom syndrome message by using a parity check matrix of a second constituent code of the Tensor Product Code; and error correcting the internal region by using a difference value between the phantom syndrome message and the error-corrected phantom syndrome message.

Preferably, the first constituent code may be a repetition code.

Preferably, the second constituent code may be a Reed-Solomon code.

In accordance with an embodiment of the present invention, a memory controller may include: a first decoder suitable for performing a first decoding operation to a message of an internal region by using an internal parity; and a second decoder suitable for performing a second decoding operation to the internal region, to which the first decoding operation is performed, by using an outer parity of an outer region wherein the message and the internal parity are included in the internal region in a matrix form and wherein the internal region and the outer region are included in a codeword received from a semiconductor memory device.

Preferably, the second decoder detects one or more errors of symbols included in one or more rows of the internal region, to which the first decoding operation may be performed, by using the outer parity of the outer region, and the second decoder may flip values of the symbols included in one or more columns, in which the error-detected symbols are included.

Preferably, after the second decoder flips the values, the first decoder may further perform the first decoding operation to the internal region, to which the second decoding operation is performed.

Preferably, the second decoding operation may be performed through a BCH code.

Preferably, the first decoding operation may be performed through a Tensor Product Code.

Preferably, the first decoder may generate a phantom syndrome message for the internal region using a parity check matrix of a first constituent code of the Tensor Product Code, the first decoder may error-correct the phantom syndrome message by using a parity check matrix of a second constituent code of the Tensor Product Code, and the first decoder may error-correct the internal region by using a difference value between the phantom syndrome message and the error-corrected phantom syndrome message.

Preferably, the first constituent code may be a repetition code.

Preferably, the second constituent code may be a Reed-Solomon code.

In accordance with various embodiments of the present invention, data stored in memory cells of a semiconductor memory device may be quickly read.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the present invention to those skilled in the art. The scope of the present invention will be understood through the claims of the present invention.

It is noted that the drawings are not necessarily to scale and, in some instances, proportions may have been exaggerated in order to more clearly illustrate the various elements of the embodiments.

Also, in the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment unless specifically indicated otherwise.

Hereinafter, various embodiments of the present invention will be described in detail with reference to the attached drawings.

Figure 1:
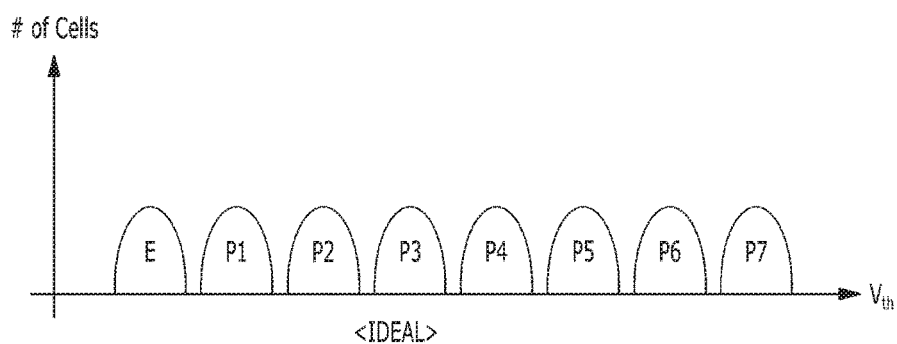
FIG. 1 is a threshold voltage distribution schematically illustrating program and erase states of a 3-bit MLC non-volatile memory device.
Figure 2:
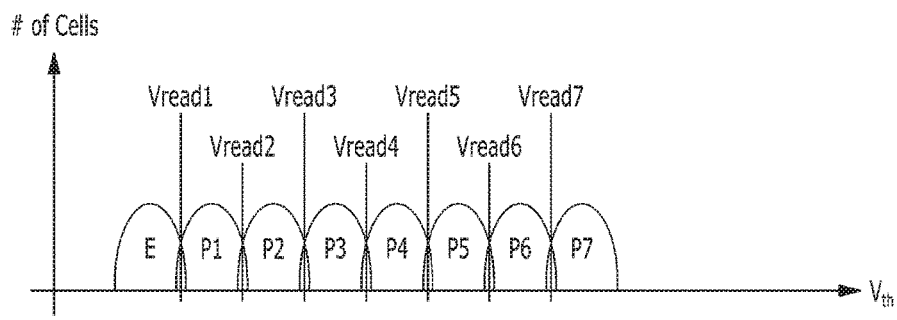
FIG. 2 is a threshold voltage distribution schematically illustrating program and erase states due to characteristic deterioration of a 3-bit MLC non-volatile memory device.
Figure 3:
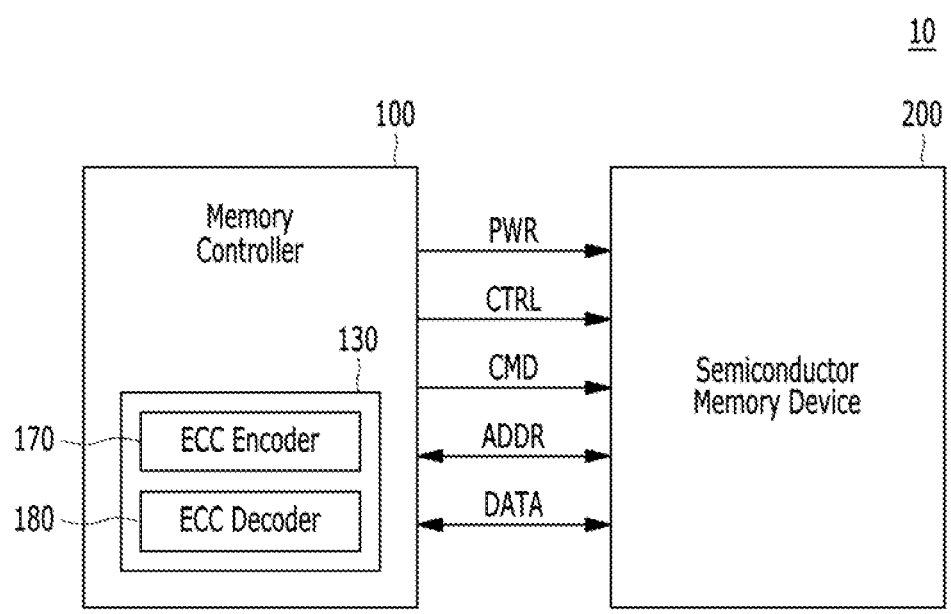
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
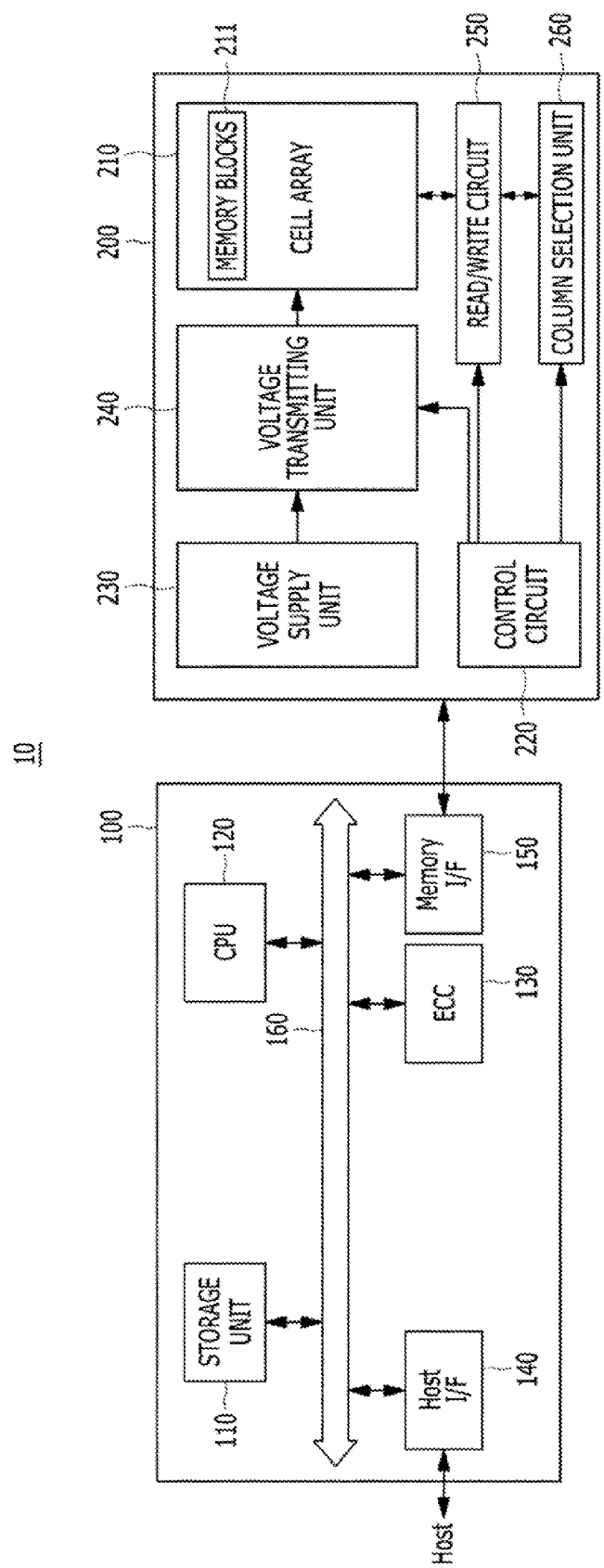
FIG. 4A is a detailed block diagram illustrating the semiconductor memory system of FIG. 3.

FIG. 4A illustrates the semiconductor memory system 10 in further detail.

Figure 4B:
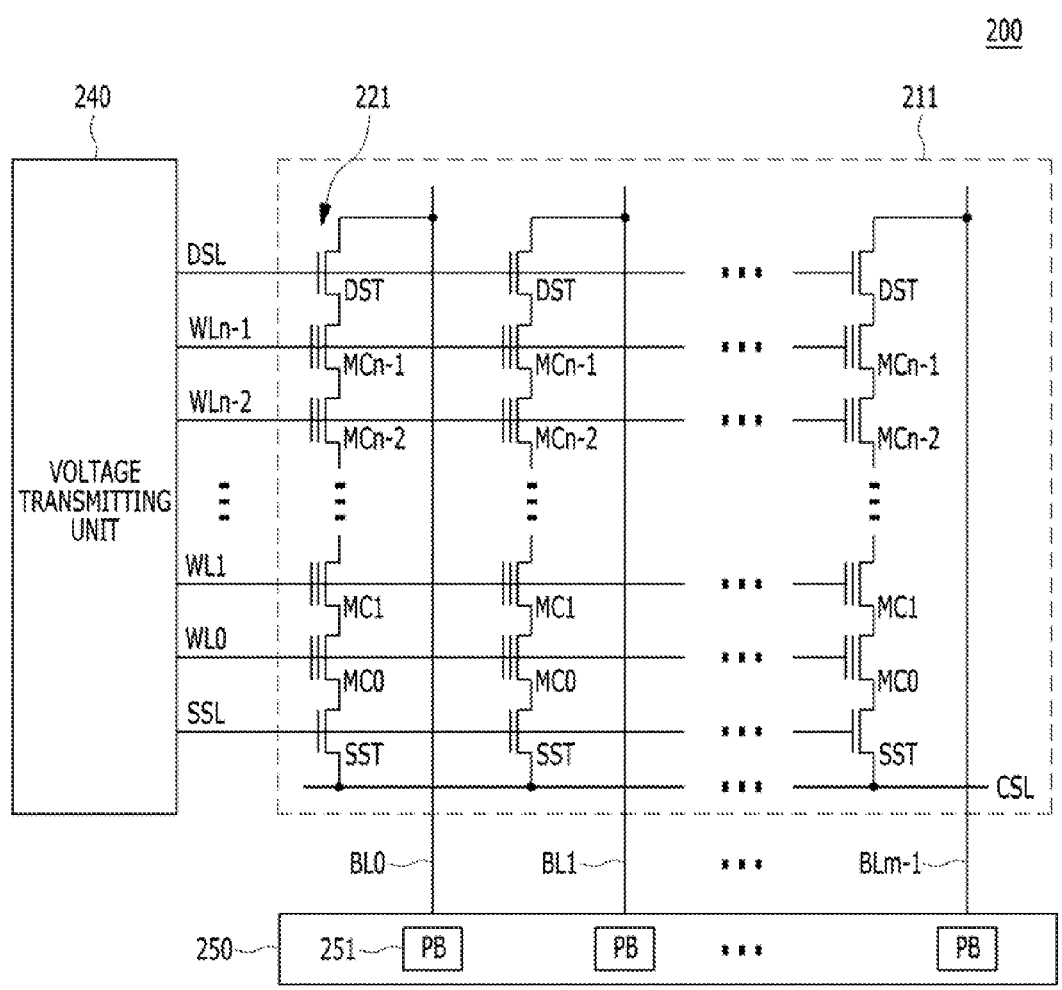
FIG. 4B is a circuit diagram illustrating an exemplary configuration of a memory block employed in the semiconductor memory system of FIG. 4A.

FIG. 4B is a circuit diagram illustrating an exemplary embodiment of a memory block 211 of FIG. 4A.

Referring to FIGS. 3 to 4B, the semiconductor memory system 10 may include a semiconductor memory device 200 and a memory controller 100 operatively coupled to the semiconductor memory device 200.

The semiconductor memory device 200 may perform one or more of an erase, a program, and a read operation under the control of the memory controller 100. The semiconductor memory device 200 may receive a command CMD, an address ADDR and data DATA through one or more input/output lines from the memory controller 100. The semiconductor memory device 200 may receive power PWR through a power line and a control signal CTRL through a control line from the memory controller 100. The control signal may include a command latch enable (CLE) signal, an address latch enable (ALE) signal, a chip enable (CE) signal, a write enable (WE) signal, a read enable (RE) signal, and so on.

The memory controller 100 may control the overall operations of the semiconductor memory device 200. The memory controller 100 may include an ECC unit 130 for correcting error bits. The ECC unit 130 may include an ECC encoder 170 and an ECC decoder 180.

The ECC encoder 170 may perform an error correction encoding operation on data to be programmed into the semiconductor memory device 200 to output data to which parity bits are added. The encoded data with the parity bits may be stored in the semiconductor memory device 200.

The ECC decoder 180 may perform an error correction decoding operation on data read from the semiconductor memory device 200. The ECC decoder 180 may determine whether the error correction decoding operation is successful, and may output an instruction signal based on the determination result. The ECC decoder 180 may correct error bits of data using the parity bits generated by the ECC encoding operation.

When the number of error bits exceeds the error correction capacity of the ECC unit 130, the ECC unit 130 may not correct the error bits. In this case, the ECC unit 130 may generate an error correction fail signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and the like. The ECC unit 130 may include all circuits, systems, or devices for error correction.

The ECC unit 130 may perform an error bit correction operation using hard decision read data, or soft decision read data or a combination of hard and soft decision read data. In accordance with an embodiment of the present invention, the ECC unit 130 may perform an error bit correction operation using hard decision read data and soft decision read data.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The SSD may store data in the semiconductor memory device 200. When the semiconductor memory system 10 is used in an SSD, the operation speed of a host (not shown) which may be coupled to the semiconductor memory system 10 may be improved significantly.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (mini D) card, a micro secure digital (microSD) card, a secure digital high capacity (SDHC), and a universal flash storage (UFS).

For another example, the semiconductor memory system 10 may be provided as one of various elements comprising an electronic apparatus such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or of a computing system.

Referring to FIG. 4A, in an embodiment, the memory controller 100 may include, in addition to the ECC unit 130, a storage unit 110, a CPU 120, a host interface 140, a memory interface 150 and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may interface with the semiconductor memory device 200. The CPU 120 may perform various control operations.

The semiconductor memory device 200, according to an embodiment, may include a memory cell array 210, a control circuit 220, a voltage supply unit 230, a voltage transmitting unit 240, a read/write circuit 250, and a column selection unit 260.

The memory cell array 210 may include a plurality of memory blocks 211. Data, for example, user data, parity data and metadata may be stored in the memory blocks 211.

Referring to FIG. 4B, an exemplary configuration of the memory block 211 may include a plurality of cell strings 221 electrically coupled to a plurality of corresponding bit lines BL0 to BLm-1, respectively. The cell string 221 of each column may include one or more drain selection transistors DST and one or more source selection transistors SST. A plurality of memory cells or memory cell transistors may be serially coupled between the drain and the source selection transistors DST and SST. Each of the memory cells MC0 to MCn-1 may be preferably formed of a multi-level cell (MLC) storing data information of multiple bits in each cell.

FIG. 4B exemplarily illustrates a memory block 211 comprising a plurality of NAND-type flash memory cells. However, the memory block 211 of the semiconductor memory device 200 is not be limited in this way. For example, the memory block 211 may comprise a plurality of NOR-type flash memory cells, or a plurality of hybrid flash memory cells in which two or more types of memory cells are combined. In an embodiment employing a NAND flash memory, a controller may be embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control the overall operations including operations related to program, erase, and read operations of the semiconductor memory device 200.

The voltage supply unit 230 may provide word line voltages, for example, a program voltage, a read voltage, and a pass voltage, to the respective word lines as may be needed according to an operation mode, and may provide a voltage to be supplied to a bulk, for example, a well region in which the memory cells are formed. A voltage generating operation of the voltage supply circuit 230 may be performed under the control of the control circuit 220.

The voltage supply unit 230 may generate a plurality of variable read voltages corresponding to the various threshold voltage distributions of the memory cells for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During a normal read operation, the column selection unit 260 may output the data read from the read/write circuit 250 to the outside, for example, to the memory controller 100, based on column address information. On the other hand, during a verification read operation, the read data may be provided to a pass/fail verification circuit (not illustrated) included in the semiconductor memory device 200, and may be used for determining whether a program operation of the memory cell succeeds.

During a program operation, the read/write circuit 250 may operate as a write driver for driving the bit lines according to data to be stored in the memory cell array 210. During a program operation, the read/write circuit 250 may receive data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality latches may be included in each of the page buffers 251.

Figure 5:
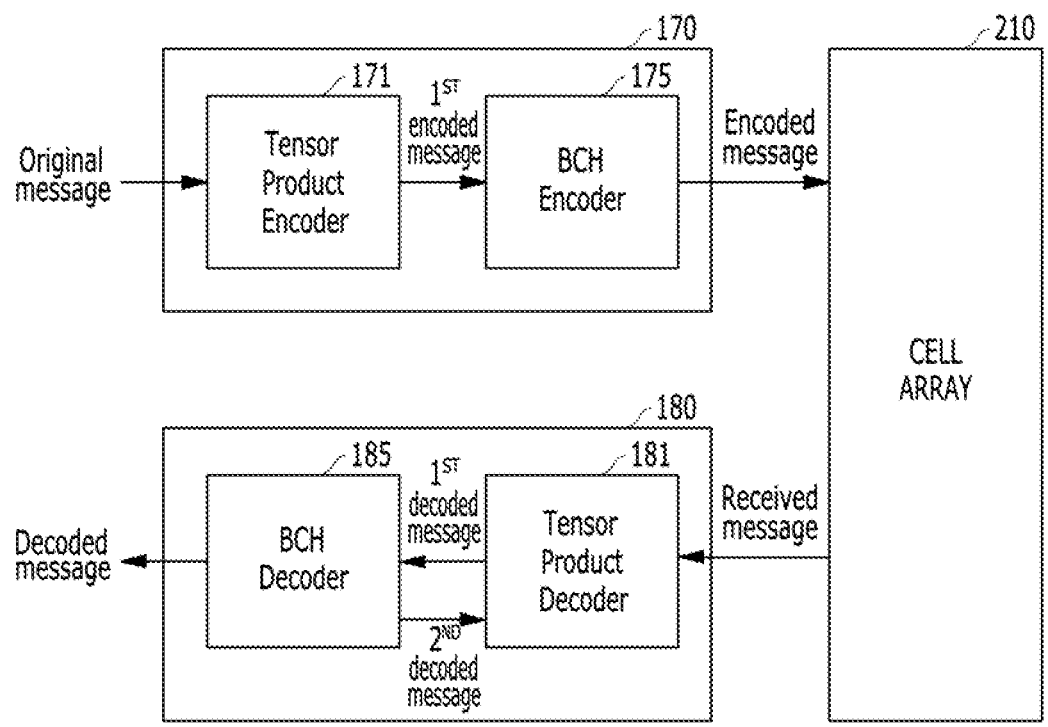
FIG. 5 is a block diagram illustrating an ECC encoder and an ECC decoder in accordance with an embodiment of the present invention.

FIG. 5 is a block diagram illustrating the ECC encoder 170 and the ECC decoder 180.

Figure 6:
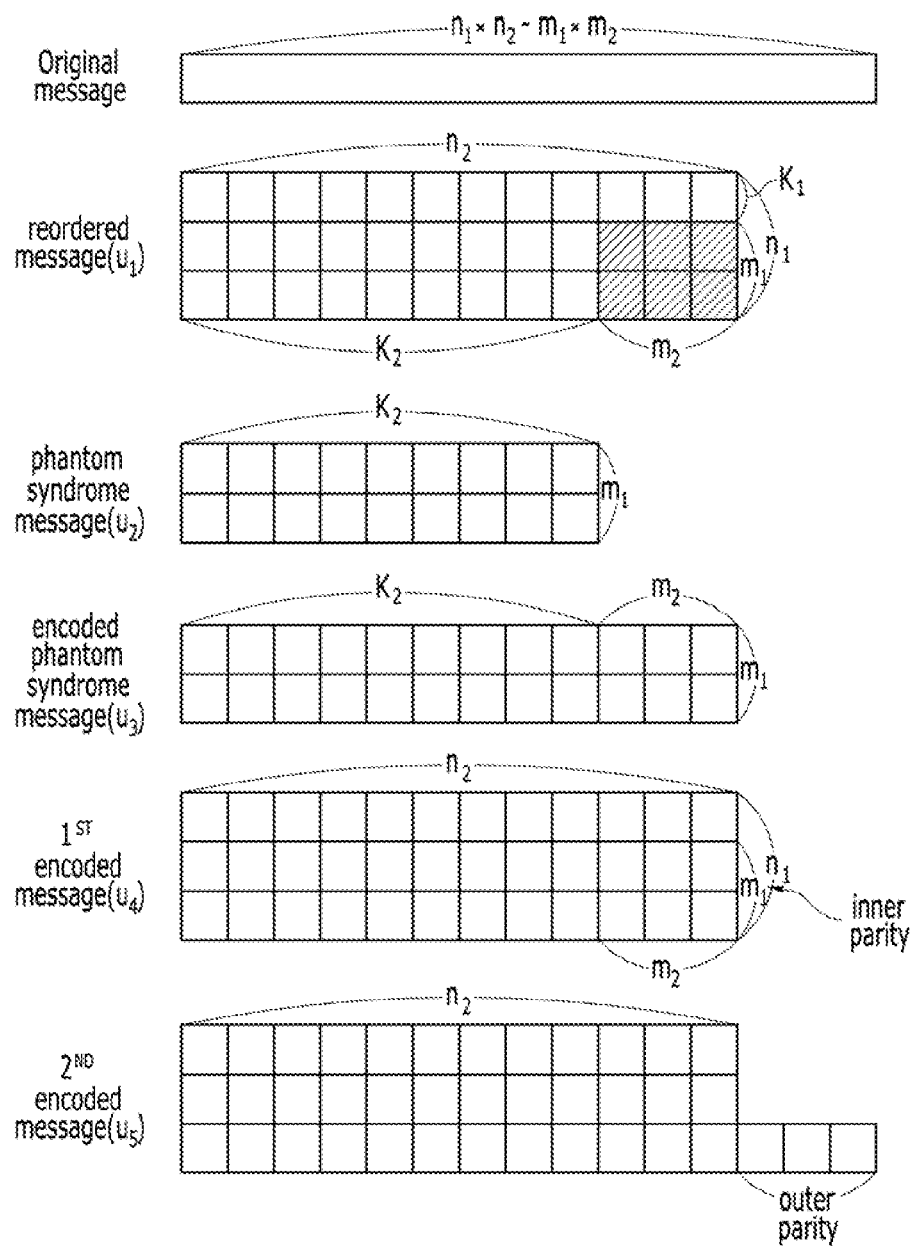
FIG. 6 is a schematic diagram illustrating messages generated during an operation of the ECC encoder.

FIG. 6 is a schematic diagram illustrating messages generated during an operation of the ECC encoder 170.

Figure 7:
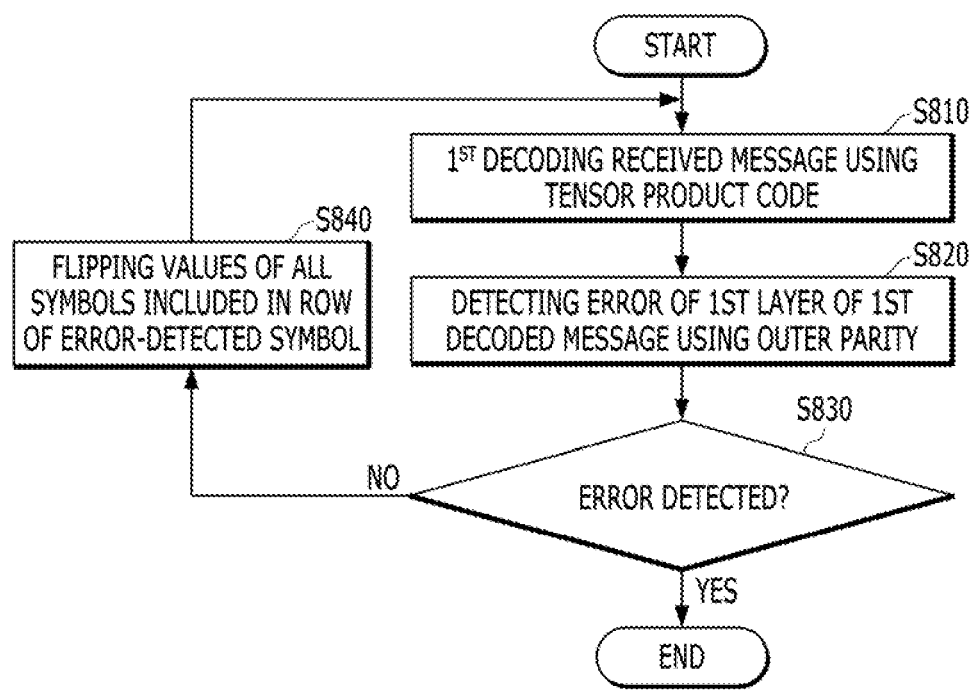
FIG. 7 is a flowchart illustrating an operation of the ECC decoder.

FIG. 7 is a flowchart illustrating an operation of the ECC decoder 180.

Figure 8:
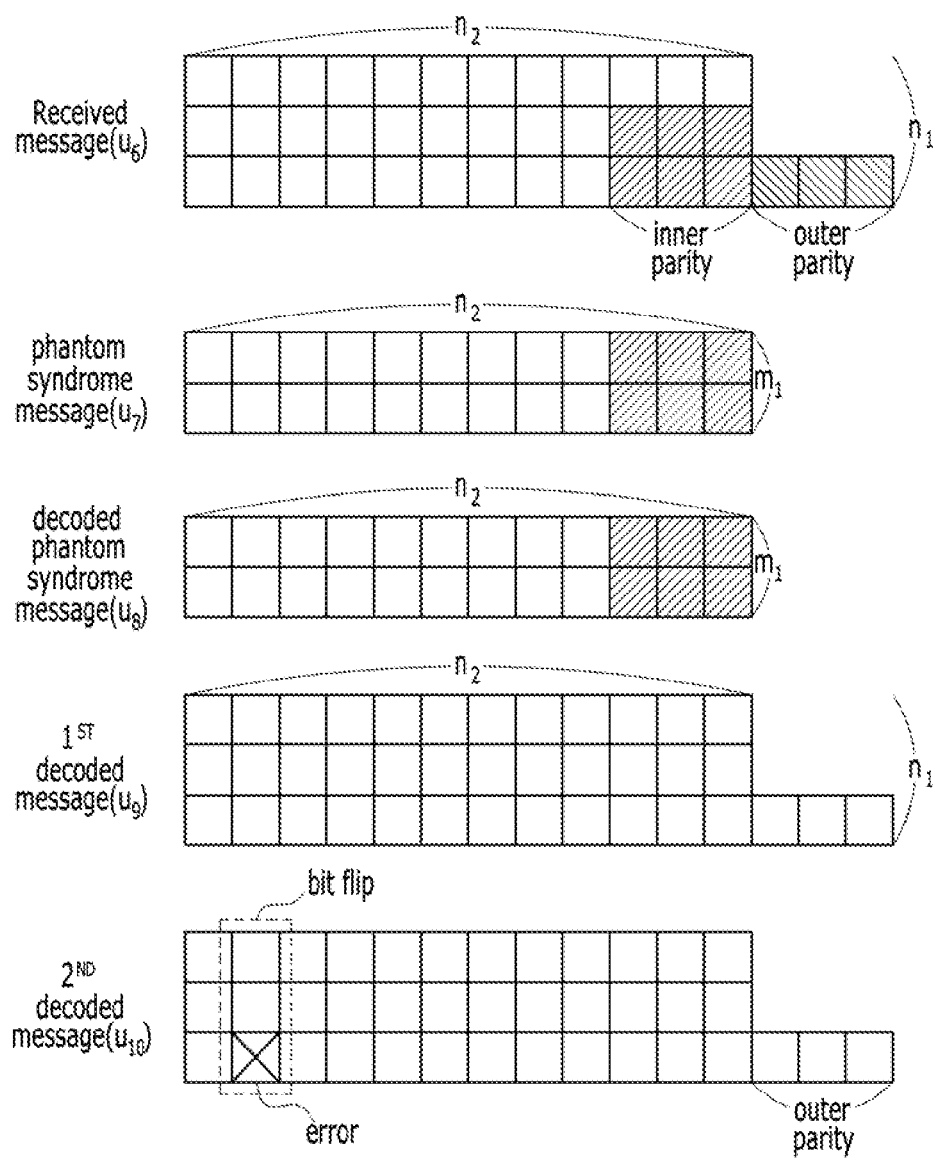
FIG. 8 is a diagram illustrating messages generated during an operation of the ECC decoder.

FIG. 8 is a diagram illustrating messages generated during an operation of the ECC decoder 180.

The Tensor product code is an error correction code, a parity check matrix $H_{TP}$ of which is implemented through a tensor product of parity check matrixes of two (2) constituent codes. The parity check matrix $H_{TP}$ of the Tensor product code may be represented by a tensor product of first and second parity check matrixes $H_1$ and $H_2$ of first and second constituent codes of the Tensor product code, respectively, as shown in following equation 1.

$$H_{TP} = H_1 \otimes H_2 \quad \text{[Equation 1]}$$

In equation 1, $\otimes$ represents the tensor product. For example, when the first parity check matrix $H_1$ of the first constituent code of the Tensor product code has $n_1$ numbers of rows and $m_1$ numbers of columns and the second parity check matrix $H_2$ of the second constituent code of the Tensor product code has $n_2$ numbers of rows and $m_2$ numbers of columns, the parity check matrix $H_{TP}$ of the Tensor product code is a matrix having $(n_1 \times n_2)$ numbers of rows and $(m_1 \times m_2)$ numbers of columns.

Accordingly, when performing the tensor-product-encoding operation to an original message having a size of $((n_1 \times n_2)-(m_1 \times m_2))$ through the Tensor product code, an encoded message having a size of $(n_1 \times n_2)$ may be generated. That is, the encoded message having a size of $(n_1 \times n_2)$ may be generated by adding a parity message having a size of $(m_1 \times m_2)$ to the original message having a size of $((n_1 \times n_2)-(m_1 \times m_2))$. For example, the Tensor product code may use a (3,1) repetition code as the first constituent code and an arbitrary code (e.g., a (5,3) Reed-Solomon code) as the second constituent code.

Hereinafter, described with reference to FIGS. 5 and 6 will be a process of the ECC encoder 170 to encode an original message into an encoded message.

Referring to FIG. 5, the ECC encoder 170 may include a Tensor Product encoder 171 and a Block-wise Concatenated Bose-Chadhuri-Hocquenghem (BCH) encoder 175. In accordance with another embodiment of the present invention, the BCH encoder 175 may be substituted for with another kind of encoder such as an, for example, an encoder using coded modulation including a Low Density Parity Check code (LDDC), a turbo code, a Reed-Solomon code, a convolution code, a recursive systematic code (RSC), a trellis-coded modulation (TCM), a Block coded modulation (BCM) and the like.

Referring to FIG. 5, the Tensor Product encoder 171 may generate a first encoded message by performing the tensor-product-encoding operation to an original message provided through a host interface 140.

As exemplified in FIG. 6, the Tensor Product encoder 171 may allocate respective symbols of the original message having a size of $((n_1 \times n_2)-(m_1 \times m_2))$ into respective locations in a reordered message $U_1$ according to a predetermined order.

As exemplified in FIG. 6, when the reordered message $U_1$ is represented by a matrix having a size of $(n_1 \times n_2)$, the Tensor Product encoder 171 may allocate respective symbols of the original message into respective locations in the reordered message $U_1$ except for region of $(k_1+1)^{th}$ to $(n_1)^{th}$ rows and $(k_2+1)^{th}$ to $(n_2)^{th}$ columns (i.e., slashed area in the reordered message $U_1$ in FIG. 6). Here, the $k_1$ may have a value of $(n_1-m_1)$ and the $k_2$ may have a value of $(n_2-m_2)$.

An order of the respective symbols of the original message that Tensor Product encoder 171 allocates into respective locations in the reordered message $U_1$ may be predetermined. The predetermined order may be an order of rows in the reordered message $U_1$ or an order of columns in the reordered message $U_1$.

Then, the Tensor Product encoder 171 may generate a phantom syndrome message $U_2$ by performing product operation to the symbols allocated to first to $(k_2)^{th}$ columns in the reordered message $U_1$ and the parity check matrix $H_1$ of the first constituent code. That is the Tensor Product encoder 171 may generate the phantom syndrome message $U_2$ by performing product operation to the symbols allocated to first to $(k_2)^{th}$ columns in the reordered message $U_1$ and the parity check matrix $H_1$ of the first constituent code, as represented by following equation 2.

$$i^{th} \text{ column of } U_2 = H_1 \times i^{th} \text{ column of } U_1 \quad \text{[Equation 2]}$$

In equation 2, "$i^{th}$ column of $U_2$" may represent a $(i)^{th}$ column in the phantom syndrome message $U_2$, "$i^{th}$ column of $U_1$" represents an $(i)^{th}$ column in the reordered message $U_1$, $H_1$ represents the first parity check matrix of the first constituent code. Here, "i" is an integer between one (1) and $k_2$. Referring to equation 2, when the first parity check matrix $H_1$ of the first constituent code has a size of 2 rows and 3 columns and the reordered message $U_1$ has a size of 3 rows, the phantom syndrome message $U_2$ may have a size of 2 rows. In FIG. 6, the phantom syndrome message $U_2$ is exemplified as a matrix having a size of 2 rows and $k_2$ columns.

Then, the Tensor Product encoder 171 may generate an encoded phantom syndrome message $U_3$ by encoding the phantom syndrome message $U_2$ through the second constituent code. The encoded phantom syndrome message $U_3$ may include a region of the phantom syndrome message $U_2$ and a region of a first parity message. In FIG. 6, the encoded phantom syndrome message $U_3$ is exemplified as a matrix having a size of 2 rows and $n_2$ (=$k_2+m_2$) columns. That is, referring to FIG. 6, the encoded phantom syndrome message $U_3$ may include a region of the first parity message having a size of 2 rows and $m_2$ columns.

Lastly, the Tensor Product encoder 171 may generate a first encoded message $U_4$ by calculating the region of $(k_1+1)^{th}$ to $(n_1)^{th}$ rows and $(k_2+1)^{th}$ to $(n_2)^{th}$ columns in the reordered message $U_1$ (i.e., slashed area in the reordered message $U_1$ in FIG. 6) through the relationship of equation 2 between the reordered message $U_1$ and the phantom syndrome message $U_2$ and by reflecting a result of the calculation into the reordered message $U_1$. A region of $(k_1+1)^{th}$ to $(n_1)^{th}$ rows and $(k_2+1)^{th}$ to $(n_2)^{th}$ columns in the first encoded message $U_4$ may be a region of a second parity message, which is an internal parity message.

Referring to FIG. 5, the BCH encoder 175 may generate a second encoded message $U_5$ by performing BCH encoding operation to one or more layers or one or more rows of the first encoded message $U_4$ provided from the Tensor Product encoder 171 and store the second encoded message $U_5$ into the semiconductor memory device 210.

As exemplified in FIG. 6, the BCH encoder 175 may generate the second encoded message $U_5$ by performing BCH encoding operation to a single row (e.g. an $(n_1)^{th}$ row) of the first encoded message $U_4$ and generating an outer parity message.

As described above, the ECC encoder 170 may generate the first encoded message $U_4$ as a result of the tensor-product-encoding operation to the original message as a first encoding operation, and may generate the second encoded message $U_5$ as a result of the BCH encoding operation to one or more rows in the first encoded message $U_4$ as a second encoding operation.

As described above, the second encoded message $U_5$ to be stored in the semiconductor memory device 210 may include an internal region in a matrix form having an original message and an internal parity message, and an outer region having an outer parity message for one or more rows in the internal region.

As described above, the ECC encoder 170 may perform the BCH encoding operation as the second encoding operation to one or more rows in the first encoded message $U_4$, which is tensor-product-encoded, and therefor allow the ECC decoder 180 to precisely error-correct an error pattern of the Tensor product code, in which it is impossible to correct error.

Hereinafter, described with reference to FIGS. 5, 7 and 8 will be a process of the ECC decoder 180 to decode a received message into a decoded message.

Referring to FIG. 5, the ECC decoder 180 may include a Tensor Product decoder 181 and a BCH decoder 185. In accordance with an embodiment of the present invention, the BCH decoder 185 may be implemented through other kinds of encoders such as an encoder using coded modulation including a Low Density Parity Check code (LDPC), a turbo code, a Reed-Solomon code, a convolution code, a recursive systematic code (RSC), a trellis-coded modulation (TCM), a Block coded modulation (BCM) and so forth. When the BCH decoder 185 is implemented to a decoder using other kinds of coded modulation, the BCH encoder 175 needs to be implemented to an encoder using the same kind of coded modulation as the BCH decoder 185.

Referring to FIGS. 7 and 8, at step S810, the Tensor Product decoder 181 may generate a first decoded message $U_9$ by performing a tensor-product-decoding operation to a received message $U_6$, which is provided through the semiconductor memory device 210, as a first decoding operation. Here, the received message $U_6$ may correspond to the second encoded message $U_6$, in which an error may occur while storing the second encoded message $U_5$ into and reading the second encoded message $U_5$ from the semiconductor memory device 210. That is, the second encoded message $U_5$ and the received message $U_6$ may have a relationship according to the following equation 3.

$$\text{received message} = 2^{nd}\text{ encoded message} + \text{error} \quad \text{[Equation 3]}$$

The tensor-product-decoding operation of the Tensor Product decoder 181 may be a reversed process of the tensor-product-encoding operation of the Tensor Product encoder 171.

As exemplified in FIG. 8, the Tensor Product decoder 181 may generate a phantom syndrome message $U_7$ by performing product operation to the symbols allocated to each of first to $(n_2)^{th}$ columns of the received message $U_6$ provided from the semiconductor memory device 210 and the parity check matrix $H_1$ of the first constituent code. That is, the Tensor Product decoder 181 may generate the phantom syndrome message $U_7$ by sequentially performing product operation to the symbols allocated to each of the first to $(n_2)^{th}$ columns in the received message $U_6$ and the parity check matrix of the first constituent code, as represented by following equation 4. Here, since the phantom syndrome message $U_7$ is generated through the sequential product operation to the symbols allocated to each of the first to $(n_2)^{th}$ columns in the received message $U_6$ and the parity check matrix $H_1$ of the first constituent code, the phantom syndrome message $U_7$ may also include an error, like the received message $U_6$.

$$i^{th}\text{ column of }U_7 = H_1 \times i^{th}\text{ column of }U_6 \quad \text{[Equation 4]}$$

In equation 4, "$i^{th}$ column of $U_7$" represents an $(i)^{th}$ column in the phantom syndrome message $U_7$, "$i^{th}$ column of $U_6$" represents an $(i)^{th}$ column in the received message $U_6$, $H_1$ represents the first parity check matrix of the first constituent code. Here, "i" may be an integer between one (1) and $n_2$.

Then, the Tensor Product decoder 181 may generate a decoded phantom syndrome message $U_6$ by decoding the phantom syndrome message $U_7$ through the second constituent code. That is, the Tensor Product decoder 181 may generate the decoded phantom syndrome message $U_8$ by error-correcting the phantom syndrome message $U_7$ through the second constituent code.

Lastly, the Tensor Product decoder 181 may generate the first decoded message $U_9$ by calculating differences of the symbols included in the respective columns of the decoded phantom syndrome message $U_8$ and the symbols included in the respective columns of a corresponding phantom syndrome message $U_7$, and by adding a predetermined error correction value, which corresponds to a difference of each column, to the symbols of a corresponding column of the received message $U_6$.

Following equation 5 may represent a party check matrix $H_1$ of a (3, 1) repetition code.

$$H_1 = \begin{bmatrix} 1 & 0 & 1 \\ 0 & 1 & 1 \end{bmatrix} \quad \text{[Equation 5]}$$

Following table 1 shows relations among a first error value, a difference value, an error correction value and a second error value when the first parity check matrix $H_1$ of the first constituent code is the (3, 1) repetition code shown in equation 5.

TABLE 1

| $1^{st}$ error value | difference value | error correction value | $2^{nd}$ error value |
|---|---|---|---|
| 100 | 10 | 100 | 000 |
| 011 | 10 | 100 | 111 |
| 010 | 01 | 010 | 000 |
| 101 | 01 | 010 | 111 |
| 001 | 11 | 001 | 000 |
| 100 | 11 | 001 | 111 |

In table 1, the first error value may represent an error value included in each column of the received message $U_6$. The difference value may represent a difference value of the symbols included in the respective columns of the decoded phantom syndrome message $U_8$ and the symbols included in the respective columns of a corresponding phantom syndrome message $U_7$. The error correction value may represent a value added to the respective columns of the received message $U_6$. The second error value may represent a value of one or more errors that may be included in the first decoded message $U_9$ after the addition of the error correction value to the respective columns of the received message $U_6$.

As shown in table 1, when two among the first error values included in the respective columns of the received message $U_6$ have inversed values to each other (e.g., when two among the first error values included in a first column of the received message $U_6$ are "100" and "011"), corresponding difference values may be the same as each other and corresponding error correction values added to a corresponding column of the received message $U_6$ may also be the same as each other. That is when the Tensor Product decoder 181 employs the (3, 1) repetition code as the first constituent code, the Tensor Product decoder 181 may correctly error-correct the received message $U_6$ only when there is an error in one or less symbol in each column of the received message $U_6$.

For example, when the first parity check matrix $H_1$ of the first constituent code is the (3, 1) repetition code shown in equation 5 and there is an error in a single one among the symbols of a first column of the received message $U_6$, e.g., when the first error value is "100", difference value between symbols included in a first column of the decoded phantom syndrome message $U_8$ and symbols included in a first column of the phantom syndrome message $U_7$ may be "10". Accordingly, the Tensor Product decoder 181 may calculate the first decoded message $U_9$ by adding the error correction value of "100" (refer to table 1) to the symbols included in a first column of the received message $U_6$. Therefore, there may be the second error value of "000" in a first column of the first decoded message $U_9$. That is, the first decoded message $U_9$ may not have an error.

Meanwhile, when the first parity check matrix $H_1$ of the first constituent code is the (3, 1) repetition code shown in equation 5 and there are errors in two among symbols of a first column of the received message $U_6$, when the first error value is "011", difference value between symbols included in a first column of the decoded phantom syndrome message $U_8$ and symbols included in a first column of the phantom syndrome message $U_7$ may also be "10". Accordingly, the Tensor Product decoder 181 may calculate the first decoded message $U_9$ by adding the error correction value of "100"

(refer to table 1) to the symbols included in a first column of the received message $U_6$. Therefore, there may be the second error value of "111" in a first column of the first decoded message $U_9$. In order to correct the second error value, a correction value of "111" may be added to a first column of the first decoded message $U_9$.

In accordance with various exemplary embodiments of the present invention, the second error value in the first decoded message $U_9$ as described above may be corrected by concatenating the BCH decoder 185 to the Tensor Product decoder 181.

At step S820, the BCH decoder 185 may detect an error of symbols included in a layer or a row, to which the outer parity of the first decoded message $U_9$ is added, by using the outer parity.

At step S830, the BCH decoder 185 may determine whether an error of the symbols is detected.

As a result of the determination at step S830, the BCH decoder 185 may end the error correction decoding operation by outputting the first decoded message $U_9$ as the decoded message when an error of the symbols is not detected. The BCH decoder 185 may proceed to step S840 when an error of the symbols is detected.

At step S840, the BCH decoder 185 may generate a second decoded message $U_{10}$ by flipping values of the symbols included in the column where the error-detected symbols are included. For example, when an error is determined as detected in a symbol of a $(n_1)^{th}$ row and a second column, the BCH decoder 185 may generate the second decoded message $U_{10}$ by flipping values of symbols included in the second column (i.e., symbols included in first to $(n_1)^{th}$ row of the second column).

Then, as illustrated in FIG. 7 the BCH decoder 185 may repeat the first decoding operation to the second decoded message $U_{10}$ with the Tensor product code by providing the second decoded message $U_{10}$ to the Tensor Product decoder 181, or may end the error correction decoding by outputting the second decoded message $U_{10}$ as the decoded message.

As described above, the BCH decoder 185 may correct the second error value included in the first decoded message $U_9$ by flipping the values of the symbols included in the column where the error-detected symbol is included. Accordingly, in accordance with an embodiment of the present invention, the ECC decoder 180 may precisely correct an error pattern of the Tensor product code.

Figure 9:
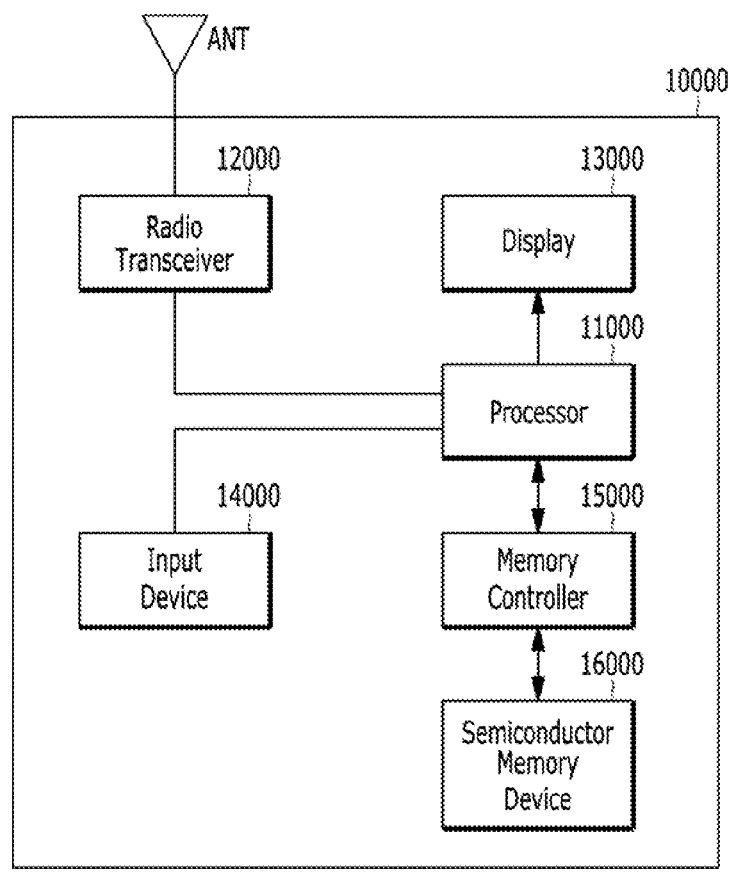
FIG. 9 is a block diagram schematically illustrating an electronic apparatus including a semiconductor memory system in accordance with an embodiment of the present invention.

FIG. 9 is a block diagram schematically illustrating an electronic apparatus 10000 including a memory controller 15000 and a semiconductor memory device 16000 in accordance with an embodiment of the present invention.

Referring to FIG. 9, the electronic apparatus 10000 may be any suitable electronic apparatus such as a cellular phone, a smart phone, or a tablet PC including the semiconductor memory device 16000 and the memory controller 15000. The semiconductor memory device 16000 may be implemented by any suitable memory device, including, for example, a flash memory device, such as NAND or a NOR flash. The memory controller 15000 may control the semiconductor memory device 16000.

The semiconductor memory device 16000 may correspond to the semiconductor memory device 200 described above with reference to FIGS. 3 to 4B. The semiconductor memory device 16000 may store random data.

The memory controller 15000 may correspond to the memory controller 100 described with reference to FIGS. 3 to 8. The memory controller 15000 may be controlled by a processor 11000 which controls the overall operations of the electronic apparatus 10000.

Data stored in the semiconductor memory device 16000 may be displayed through a display 13000 under the control of the memory controller 15000. The memory controller 15000 may operate under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000. The input device 14000 may be implemented, for example, and may be implemented by a pointing device such as a touch pad or a computer mouse, a key pad, or a keyboard.

The processor 11000 may control the display 13000 so that the data from the semiconductor memory device 16000, the radio signal from the radio transceiver 12000 or the data from the input device 14000 is displayed through the display 13000.

Figure 10:
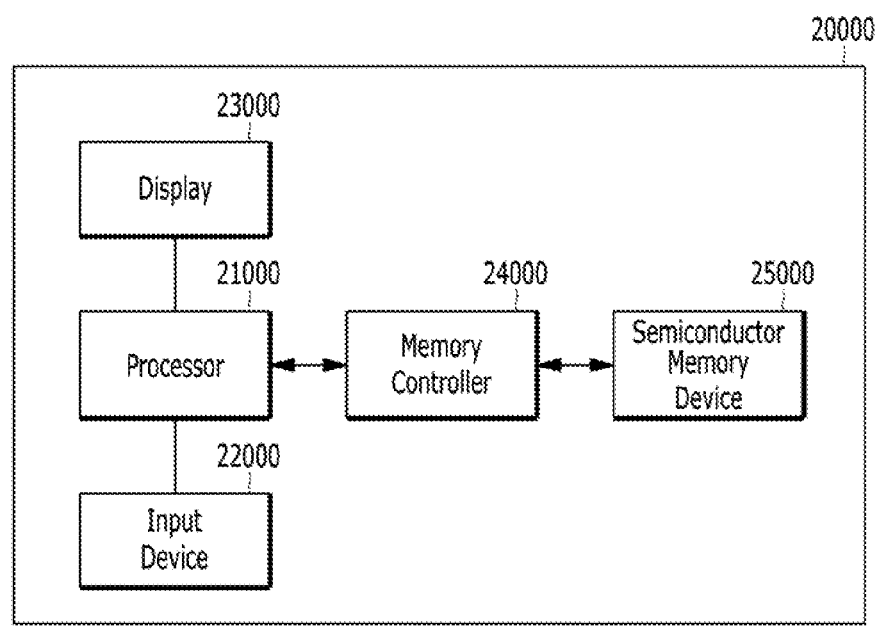
FIG. 10 is a block diagram schematically illustrating an electronic apparatus including a semiconductor memory system in accordance with another embodiment of the present invention.

FIG. 10 is a block diagram schematically illustrating an electronic apparatus 20000 including a memory controller 24000 and a semiconductor memory device 25000 in accordance with another embodiment of the present invention.

The memory controller 24000 and the semiconductor memory device 25000 may correspond to the memory controller 100 and the semiconductor memory device 200 described with reference to FIGS. 3 to 8E, respectively.

Referring to FIG. 10, the electronic apparatus 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device, and the memory controller 24000 to control operations of the semiconductor memory device 25000.

The electronic apparatus 20000 may include a processor 21000 to control overall operations of the electronic apparatus 20000. The memory controller 24000 may be controlled by the processor 21000.

The process r 21000 may display data stored in the semiconductor memory device 25000 through a display 23000 according to an input signal from an input device 22000. For example, the input device 22000 may be implemented by a pointing device such as a touch pad or a computer mouse, a key pad or a keyboard.

Figure 11:
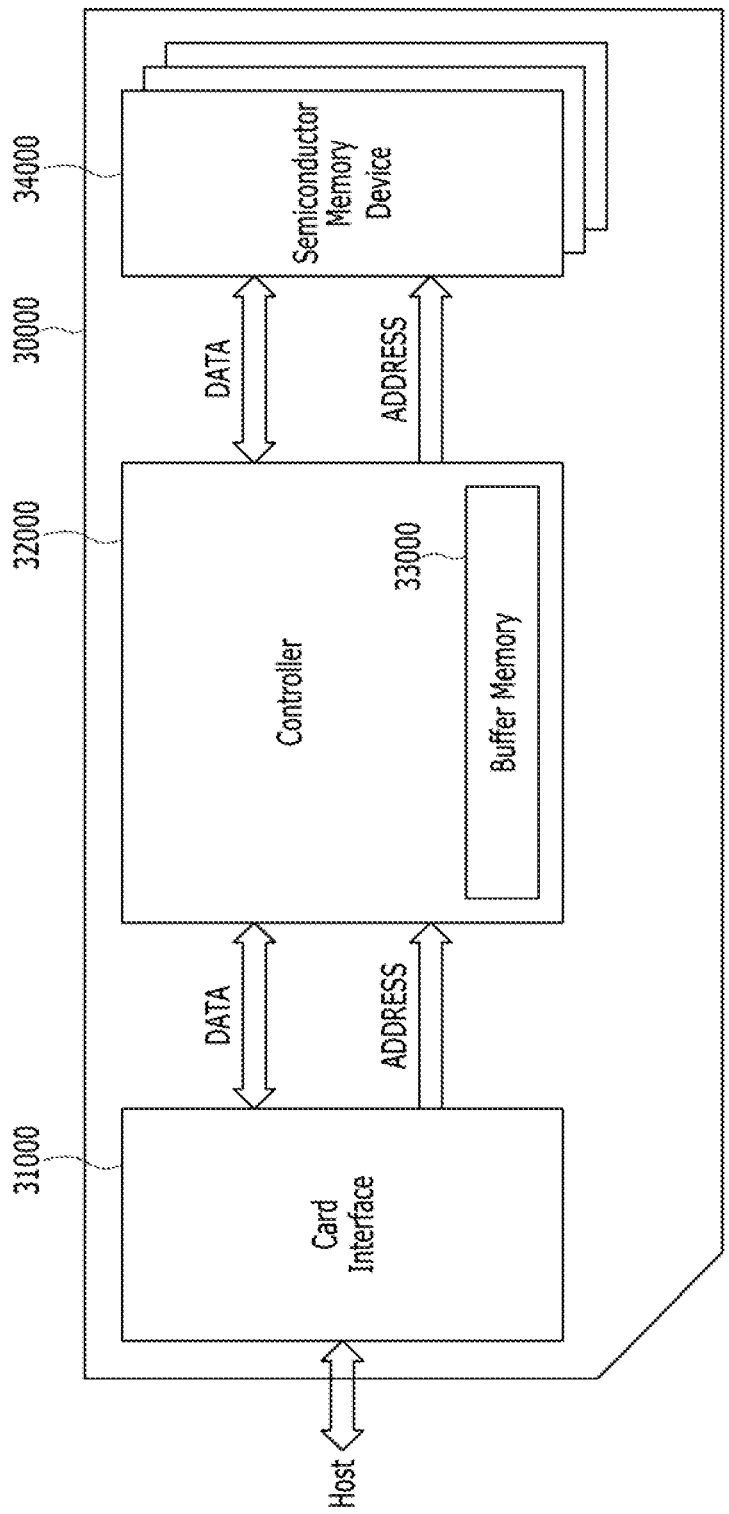
FIG. 11 is a block diagram schematically illustrating an electronic apparatus including a semiconductor memory system in accordance with yet another embodiment of the present invention.

FIG. 11 is a block diagram schematically illustrating an electronic apparatus 30000 including a controller 32000 and a semiconductor memory device 34000 in accordance with yet another embodiment of the present invention.

The controller 32000 and the semiconductor memory device 34000 may correspond to the memory controller 100 and the semiconductor memory device 200 described with reference to FIGS. 3 to 8E, respectively.

Referring to FIG. 11, the electronic apparatus 30000 may include a card interface 31000, the controller 32000, and the semiconductor memory device 34000 which may be implemented, for example, with a flash memory device.

The electronic apparatus 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic apparatus 30000.

The controller 32000 may control the overall operations of the electronic apparatus 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic apparatus 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 12:
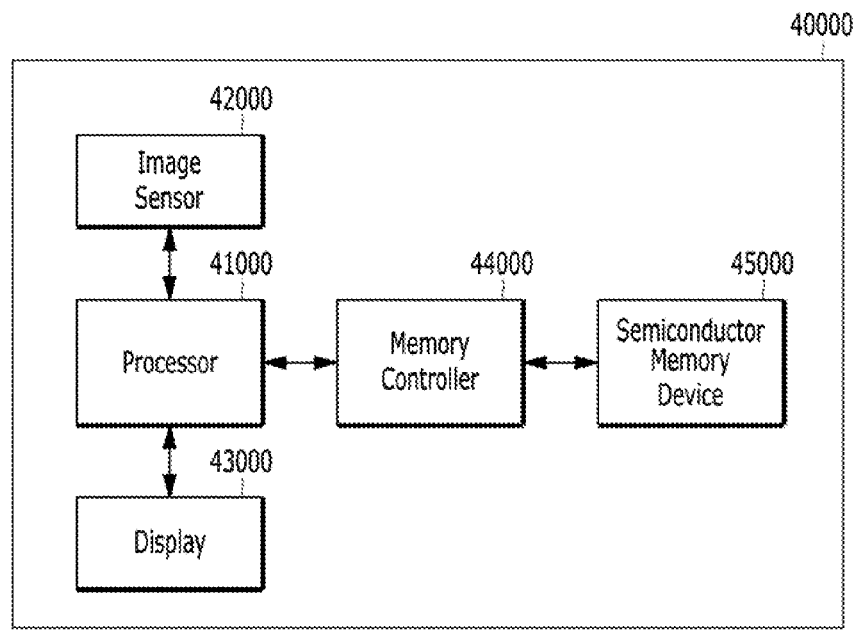
FIG. 12 is a block diagram schematically illustrating an electronic apparatus including a semiconductor memory system in accordance with yet another embodiment of the present invention.

FIG. 12 is a block diagram schematically illustrating an electronic apparatus 40000 including a memory controller 44000 and a semiconductor memory device 45000 in accordance with yet another embodiment of the present invention.

The memory controller 44000 and the semiconductor memory device 45000 may correspond to the memory controller 100 and the semiconductor memory device 200 described with reference to FIGS. 3 to 8E, respectively.

Referring to FIG. 12, the electronic apparatus 40000 may include the semiconductor memory device 45000 (e.g., a flash memory device), the memory controller 44000 to control a data processing operation of the semiconductor memory device 45000 and a processor 41000 to control overall operations of the electronic apparatus 40000.

Further, an image sensor 42000 of the electronic apparatus 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 13:
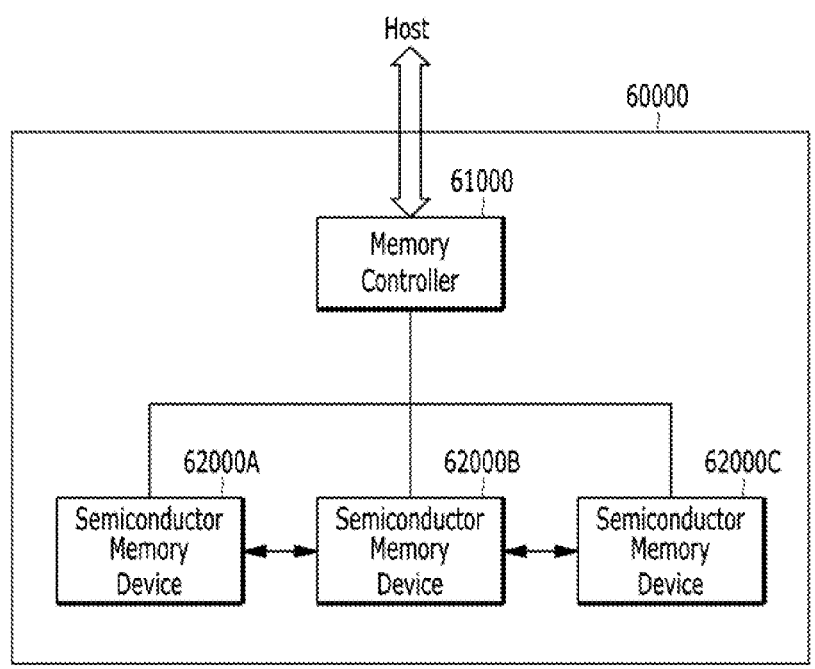
FIG. 13 is a block diagram schematically illustrating an electronic apparatus including a semiconductor memory system in accordance with yet another embodiment of the present invention.

FIG. 13 is a block diagram schematically illustrating an electronic apparatus 60000 including a memory controller 61000 and semiconductor memory devices 62000A, 62000B, and 62000C in accordance with yet another embodiment of the present invention.

The memory controller 61000 and each of the semiconductor memory devices 62000A 620008, and 62000C may correspond to the memory controller 100 and the semiconductor memory device 200 described with reference to FIGS. 3 to 8E, respectively.

Referring to FIG. 13, the electronic apparatus 60000 may be implemented by a data storage device such as a solid state drive (SSD).

The electronic apparatus 60000 may include the plurality of semiconductor memory devices 62000A, 620008, and 62000C and the memory controller 61000 to control a data processing operation of each of the semiconductor memory devices 62000A, 62000B, and 62000C.

The electronic apparatus 60000 may be implemented by a memory system or a memory module.

For example, the memory controller 61000 may be implemented outside or inside the electronic apparatus 60000.

Figure 14:
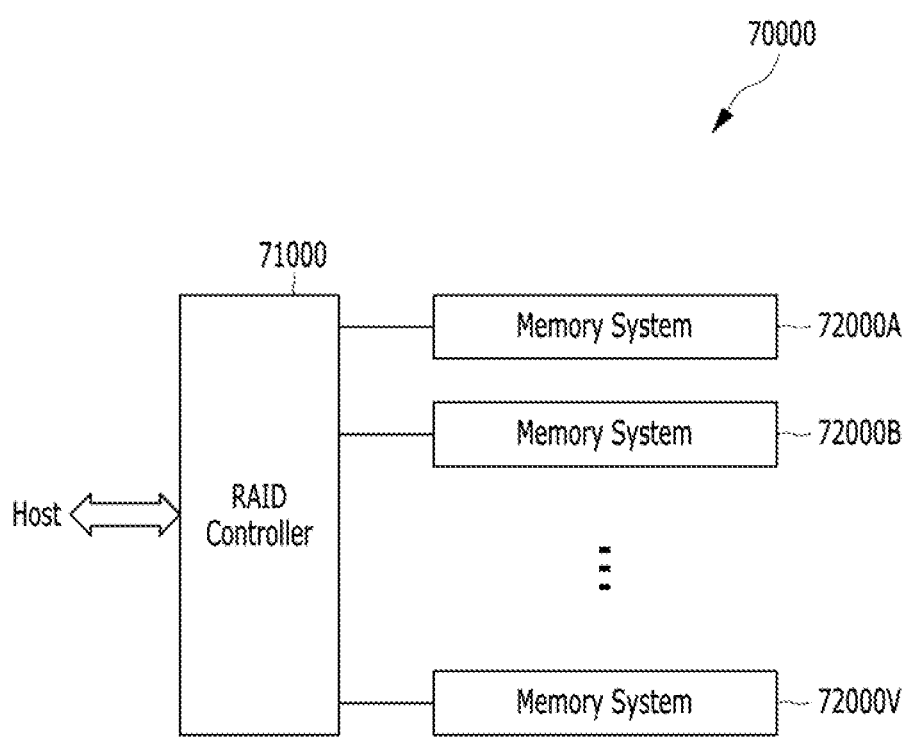
FIG. 14 is a block diagram illustrating a data processing system including the electronic apparatus of FIG. 13 in accordance with yet another embodiment of the present invention.

FIG. 14 is a block diagram of a data processing system including the electronic apparatus 60000 described with reference to FIG. 13.

Referring to FIGS. 13 and 14, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic apparatus 60000 described with reference to FIG. 13. The memory systems 72000A to 72000N may form a RAID array. The data storage device 70000 may be implemented by an SSD.

During a program operation, the RAID controller 71000 may output program data, which is output from a host, to one of the memory systems 72000A to 72000N selected according to one of a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to specific embodiments, it will be apparent to those skilled in the art that various other changes and modifications may be made without departing from the spirit and scope of the invention as defined in the following claims.

What is claimed is:

1. An operation method of a memory controller, the method comprising:
    performing a first decoding operation to a message of an internal region included in a codeword received from a semiconductor memory device by using an internal parity; and
    performing a second decoding operation to the internal region, to which the first decoding operation is performed, by using an outer parity of an outer region,
    wherein the codeword includes the internal region in a matrix form and the outer parity generated by encoding one or more rows of the internal region, and
    wherein the performing of the second decoding operation includes:
        detecting one or more errors of symbols included in the encoded one or more rows of the internal region, to which the first decoding operation is performed, by using the outer parity of the outer region; and
        flipping values of all symbols included in one or more columns, in which the error-detected symbols are included.

2. The method of claim 1, further comprising, after the flipping of the values, performing the first decoding operation to the internal region, to which the second decoding operation is performed.

3. The method of claim 1, wherein the second decoding operation is performed through a BCH code.

4. The method of claim 1, wherein the first decoding operation is performed through a Tensor Product Code.

5. The method of claim 4, wherein the performing of the first decoding operation includes:
- generating a phantom syndrome message for the internal region using a parity check matrix of a first constituent code of the Tensor Product Code;
- error correcting the phantom syndrome message by using a parity check matrix of a second constituent code of the Tensor Product Code; and
- error correcting the internal region by using a difference value between the phantom syndrome message and the error-corrected phantom syndrome message.

6. The method of claim 5, wherein the first constituent code is a repetition code.

7. The method of claim 5, wherein the second constituent code is a Reed-Solomon code.

8. A memory controller comprising:
- a first decoder suitable for performing a first decoding operation to a message of an internal region by using an internal parity; and
- a second decoder suitable for performing a second decoding operation to the internal region, to which the first decoding operation is performed, by using an outer parity of an outer region,
- wherein the internal region and the outer region are included in a codeword received from a semiconductor memory device,
- wherein the codeword includes the internal region in a matrix form and the outer parity generated by encoding one or more rows of the internal region,
- wherein the second decoder detects one or more errors of symbols included in the encoded one or more rows of the internal region, to which the first decoding operation is performed, by using the outer parity of the outer region, and
- wherein the second decoder flips values of all symbols included in one or more columns, in which the error-detected symbols are included.

9. The memory controller of claim 8, wherein, after the second decoder flips the values, the first decoder further performs the first decoding operation to the internal region, to which the second decoding operation is performed.

10. The memory controller of claim 8, wherein the second decoding operation is performed through a BCH code.

11. The memory controller of claim 8, wherein the first decoding operation is performed through a Tensor Product Code.

12. The memory controller of claim 11,
- wherein the first decoder generates a phantom syndrome message for the internal region using a parity check matrix of a first constituent code of the Tensor Product Code,
- wherein the first decoder error-corrects the phantom syndrome message by using a parity check matrix of a second constituent code of the Tensor Product Code, and
- wherein the first decoder error-corrects the internal region by using a difference value between the phantom syndrome message and the error-corrected phantom syndrome message.

13. The memory controller of claim 12, wherein the first constituent code is a repetition code.

14. The memory controller of claim 12, wherein the second constituent code is a Reed-Solomon code.

* * * * *